US012154754B2

(12) United States Patent
Chaney et al.

(10) Patent No.: US 12,154,754 B2
(45) Date of Patent: Nov. 26, 2024

(54) MOLTEN LIQUID TRANSPORT FOR TUNABLE VAPORIZATION IN ION SOURCES

(71) Applicant: Applied Materials, Inc., Santa Clara, CA (US)

(72) Inventors: Craig R. Chaney, Gloucester, MA (US); Graham Wright, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 399 days.

(21) Appl. No.: 17/835,107

(22) Filed: Jun. 8, 2022

(65) Prior Publication Data

US 2023/0402247 A1  Dec. 14, 2023

(51) Int. Cl.
*H01J 37/08* (2006.01)
*H01J 27/08* (2006.01)
*H01J 37/34* (2006.01)

(52) U.S. Cl.
CPC .............. *H01J 37/08* (2013.01); *H01J 27/08* (2013.01); *H01J 37/3435* (2013.01)

(58) Field of Classification Search
CPC ......... H01J 37/08; H01J 37/3435; H01J 27/08
See application file for complete search history.

(56) References Cited

U.S. PATENT DOCUMENTS

| 2020/0303154 A1 | 9/2020 | Bassom et al. |
| 2021/0110995 A1 | 4/2021 | Patel et al. |
| 2021/0238732 A1 | 8/2021 | Wright et al. |
| 2022/0130636 A1 | 4/2022 | Hirose |

FOREIGN PATENT DOCUMENTS

| JP | 2022-500830 A | 1/2022 |
| WO | 2019/133343 A1 | 7/2019 |

OTHER PUBLICATIONS

Dikshit et al., "Electron beam evaporation of aluminium with a porous tantalum rod in melt pool", Journal of Physics D: Applied Physics, vol. 38, pp. 2484-2488, 2005.
International Search Report and Written Opinion mailed Aug. 30, 2023 in corresponding PCT application No. PCT/US2023/021520.

*Primary Examiner* — Nicole M Ippolito
*Assistant Examiner* — Hanway Chang
(74) *Attorney, Agent, or Firm* — NIELDS, LEMACK & FRAME, LLC

(57) ABSTRACT

An ion source with a crucible is disclosed. In some embodiments, the crucible contains a solid dopant material, such as a metal. A porous wicking tip is disposed in the crucible in contact with the solid dopant material. The porous wicking tip may be a tube with one or more interior conduits. Alternatively, the porous tip may be two concentric cylinders with a plurality of rods disposed in the annular ring between the two cylinders. Alternatively, the porous tip may be one or more foil layers wound together. In each of these embodiments, the wicking tip can be used to control the flow rate of molten dopant material to the arc chamber.

19 Claims, 9 Drawing Sheets

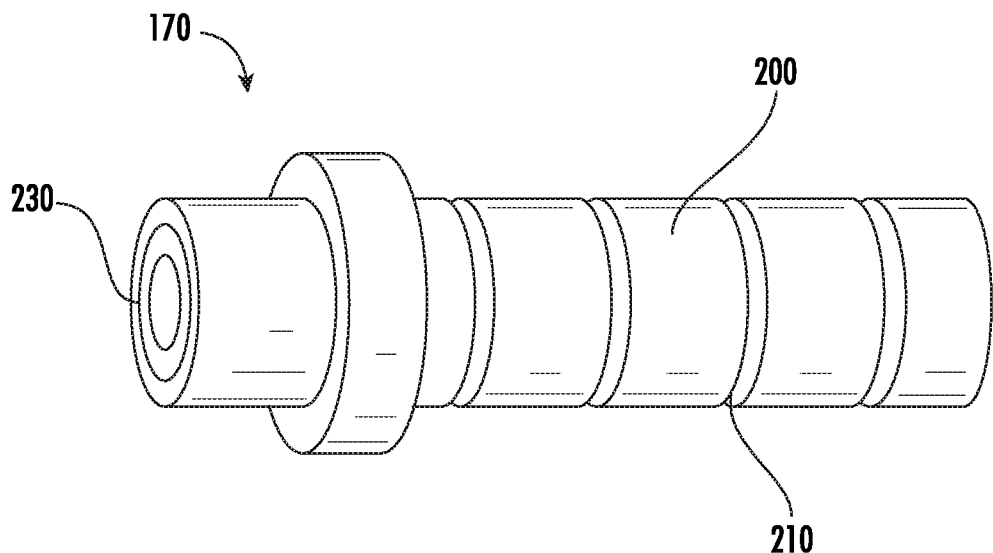
FIG. 3A
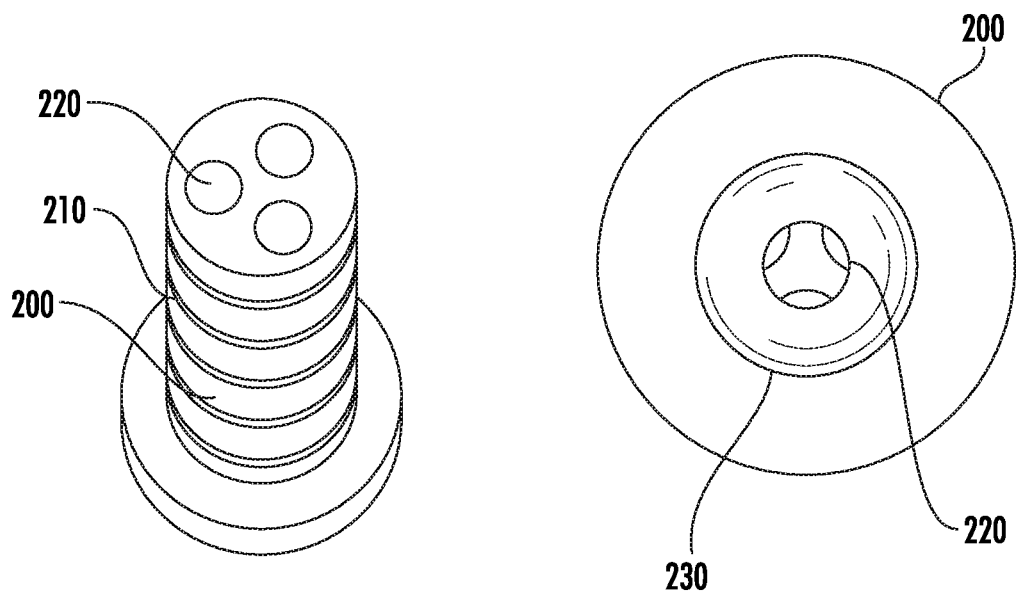
FIG. 3B
FIG. 3C

MOLTEN LIQUID TRANSPORT FOR TUNABLE VAPORIZATION IN ION SOURCES

FIELD

Embodiments of the present disclosure relate to an ion source, and more particularly, an ion source with a crucible having a porous wicking tip.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller is typically disposed on the end of the arc chamber opposite the cathode. The cathode and repeller may be biased so as to repel the electrons, directing them back toward the center of the arc chamber. In some embodiments, a magnetic field is used to further confine the electrons within the arc chamber.

In certain embodiments, it may be desirable to utilize a feed material that is in solid form as a dopant species. However, there are issues associated with using solid feed materials with IHC ion sources. For example, vaporizers used with ion sources are difficult to operate at temperatures greater than 750° Celsius. Further, there may be issues with heat shielding and condensation in the tubes that connect the vaporizer with the arc chamber. These issues may prevent the use of many solids in a vaporizer because their vapor pressure is too low at 750° Celsius. Introduction of the solid feed material into the ion source may be problematic as well. Issues, such as spillage and unregulated vaporization, may occur.

Therefore, an ion source that may be used with a solid feed material without these limitations would be beneficial. Further, it would be advantageous if the rate of vaporization could be tuned or adjusted.

SUMMARY

An ion source with a crucible is disclosed. In some embodiments, the crucible contains a solid dopant material, such as a metal. This material may be a crystal, lump, powder or a compound material. A porous wicking tip is disposed in the crucible in contact with the solid dopant material. The porous wicking tip may be a tube with one or more interior conduits. Alternatively, the porous tip may be two concentric cylinders with a plurality of rods disposed in the annular ring between the two cylinders. Alternatively, the porous tip may be one or more foil layers wound together. In each of these embodiments, the wicking tip can be used to control the flow rate of molten dopant material to the arc chamber.

According to one embodiment, an apparatus for holding dopant material in an ion source is disclosed. The apparatus comprises a crucible; and a wicking tip disposed in the crucible, wherein the wicking tip comprises: a body having one or more internal conduits; one or more openings allowing the one or more internal conduits to be in communication with the exterior of the body and an interior of the crucible; and a wicking cavity disposed at a front end of the wicking tip, wherein the one or more internal conduits flow into the wicking cavity. In some embodiments, the body comprises a cylindrical portion containing a plurality of internal conduits. In certain embodiments, a portion of the body comprises a primary outer diameter, defined such that the plurality of internal conduits are completely contained within the portion having the primary outer diameter, and wherein transport rings, which are regions having a smaller diameter than the primary outer diameter, are disposed on other portions of the body to create the one or more openings. In certain embodiments, a cross-sectional area of passageways where the plurality of internal conduits connect to the wicking cavity is smaller than a combined cross-sectional area of the plurality of internal conduits, so as to form a choke point. In some embodiments, the combined cross-sectional area of the plurality of internal conduits is 3 to 12 times larger than the cross-sectional area of passageways where the plurality of internal conduits connect to the wicking cavity. In some embodiments, the body and the one or more internal conduits are curved. In some embodiments, the wicking cavity comprises a concave cavity. In some embodiments, the body contains exactly one internal conduit. In some embodiments, the body comprises a hollow outer cylinder and a solid inner cylinder, wherein an annular ring is formed between the hollow outer cylinder and the solid inner cylinder, wherein the wicking tip further comprises rods disposed in the annular ring, wherein spacing between the rods in the annular ring comprises the one or more internal conduits. In some embodiments, the body comprises a foil wound to create the body; wherein spacing between adjacent layers of the foil comprise the one or more internal conduits.

According to another embodiment, an indirectly heated cathode ion source is disclosed. The IHC ion source comprises an arc chamber having a first end and a second end; a cathode disposed on the first end; and the apparatus described above disposed at the second end.

According to another embodiment, an indirectly heated cathode ion source is disclosed. The IHC ion source comprises an arc chamber having first end, a second end, and sidewalls connecting the first end and the second end; a cathode disposed on a first end; an actuator adapted to extend into and be retracted from the arc chamber; and the apparatus of described above disposed on an end of the actuator.

According to another embodiment, an apparatus for holding dopant material in an ion source is disclosed. The apparatus comprises a crucible; and a wicking tip disposed in the crucible, wherein the wicking tip comprises: a solid inner cylinder disposed in a hollow outer cylinder to form an annular ring; and a plurality of rods disposed in the annular ring. In some embodiments, spacing between the plurality of rods create internal conduits through which dopant material travels. In some embodiments, the plurality of rods extends beyond the hollow outer cylinder at a back end of the wicking tip to provide openings to allow the dopant material to enter the internal conduits. In some embodiments, the hollow outer cylinder extends further in a front end than the plurality of rods to create a cavity into which dopant material from the internal conduits collect. In some embodiments, the plurality of rods comprise tantalum, refractory metal or high temperature wires.

According to another embodiment, an indirectly heated cathode ion source is disclosed. The IHC ion source comprises an arc chamber having a first end and a second end; a cathode disposed on the first end; and the apparatus described above disposed at the second end.

According to another embodiment, an indirectly heated cathode ion source is disclosed. The IHC ion source comprises an arc chamber having first end, a second end, and sidewalls connecting the first end and the second end; a cathode disposed on a first end; an actuator adapted to extend into and be retracted from the arc chamber; and the apparatus of described above disposed on an end of the actuator.

BRIEF DESCRIPTION OF THE FIGURES

For a better understanding of the present disclosure, reference is made to the accompanying drawings, which are incorporated herein by reference and in which:

FIGS. 3A-3E shows a wicking tip according to one embodiment;

DETAILED DESCRIPTION

As described above, a crucible having a wicking tip is disclosed. There are several embodiments of the wicking tip.

There are several embodiments of an IHC ion source that may be used with the wicking tip. One of these embodiments include the crucible located on the second end of the arc chamber. The second embodiment includes the crucible disposed on a sidewall. Each of these embodiments will be described in more detail.

Figure 1:
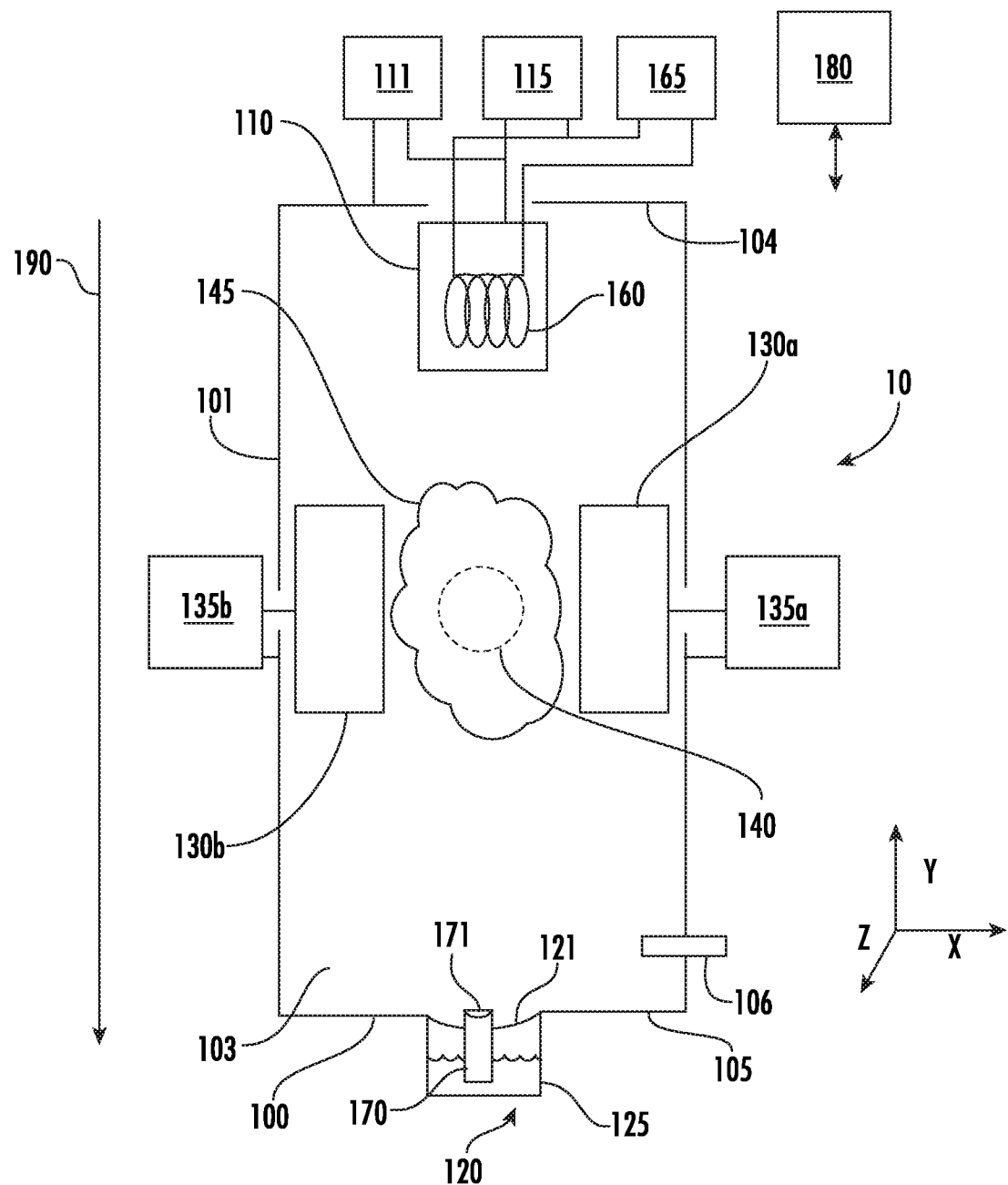
FIG. 1 is an indirectly heated cathode (IHC) ion source having a crucible with a wicking tip in accordance with one embodiment.

FIG. 1 shows a first embodiment of an IHC ion source 10 with a crucible having a wicking tip where the crucible is disposed at the second end. The IHC ion source 10 includes an arc chamber 100, comprising two opposite ends, and side walls 101 connecting to these ends. The arc chamber 100 also includes a bottom wall and a top wall. The walls of the arc chamber 100 may be constructed of an electrically conductive material and may be in electrical communication with one another. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by bias power supply 111. In other embodiments, the cathode 110 may be electrically connected to the arc chamber 100, so as to be at the same voltage as the side walls of the arc chamber 100. In these embodiments, bias power supply 111 may not be employed and the cathode 110 may be electrically connected to the side walls of the arc chamber 100. In certain embodiments, the arc chamber 100 is connected to electrical ground.

In this embodiment, a crucible 120 is disposed in the arc chamber 100 on the second end 105 of the arc chamber 100 opposite the cathode 110. The crucible 120 may be made from an electrically conductive material and may be electrically connected to the side walls of the arc chamber 100. The top of the crucible 120 may be planar with the second end 105.

In certain embodiments, a magnetic field 190 is generated in the arc chamber 100. This magnetic field is intended to confine the electrons along one direction. The magnetic field 190 typically runs parallel to the side walls 101 from the first end 104 to the second end 105. For example, electrons may be confined in a column that is parallel to the direction from the cathode 110 to the crucible 120 (i.e. the y direction). Thus, electrons do not experience any electromagnetic force to move in the y direction. However, movement of the electrons in other directions may experience an electromagnetic force.

In the embodiment shown in FIG. 1, first electrode 130a and second electrode 130b may be disposed on respective opposite side walls 101 of the arc chamber 100, such that the first electrode 130a and the second electrode 130b are within the arc chamber 100. The first electrode 130a and the second electrode 130b may each be biased by a respective power supply. In certain embodiments, the first electrode 130a and the second electrode 130b may be in communication with a common power supply. However, in other embodiments, to allow maximum flexibility and ability to tune the output of the IHC ion source 10, the first electrode 130a may be in communication with a first electrode power supply 135a and the second electrode 130b may be in communication with a second electrode power supply 135b.

The first electrode power supply 135a and the second electrode power supply 135b serve to bias the first electrode 130a and the second electrode 130b, respectively, relative to the side walls of the arc chamber 100. In certain embodiments, the first electrode power supply 135a and the second electrode power supply 135b may bias the first electrode 130a and the second electrode 130b positively or negatively relative to the side walls 101 of the arc chamber 100. In certain embodiments, at least one of the electrodes may be biased at between 40 and 500 volts relative to the side walls 101 of the arc chamber 100.

Each of the cathode 110, the crucible 120 and the electrodes are made of an electrically conductive material, such as a metal or graphite.

Disposed on another side of the arc chamber 100, referred to as the face plate 103, may be an extraction aperture 140.

In FIG. 1, the extraction aperture 140 is disposed on a side that is parallel to the X-Y plane (parallel to the page). Further, the IHC ion source 10 also comprises a gas inlet 106 through which the gas to be ionized is introduced to the arc chamber 100.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

A dopant material 125, such as indium, aluminum, antimony or gallium, may be disposed within the crucible 120. The dopant material 125 may be in the form of a solid when placed in the crucible 120. In some embodiments, the dopant material 125 may be a crystal, lump, powder or a compound material. However, in certain embodiments, the dopant material 125 may melt and become a liquid. Therefore, in certain embodiments, the ion source 10 is configured such that the crucible 120 is located on the lowest side (i.e. the side closest to ground) so that melted dopant material does not flow from the crucible 120 into the arc chamber 100, but rather remains in the crucible 120. In other words, the ion source 10 is oriented such that the dopant material 125 is retained in the crucible 120 by gravity.

The wicking tip 170 is disposed in the crucible 120. The wicking tip 170 extends into the crucible 120. In some embodiments, the wicking tip 170 extends to the bottom of the crucible such that dopant material 125 remains in contact with the wicking tip 170, even as the dopant material is consumed. The crucible 120 may include a front surface that forms a crucible cavity 121. This crucible cavity 121 may be concave, or another inward depression. The front surface refers to the surface that is in communication with the interior of the arc chamber 100. In certain embodiments, the wicking tip 170 includes the wicking cavity 171. The wicking cavity 171 may be concave. However, it is understood that other shapes may also be used. For example, the wicking cavity 171 may be a counterbore having different shapes. Any inward depression or holes on the front surface may serve as the wicking cavity 171. In some embodiments, both the crucible 120 and the wicking tip 170 have concave cavities. In each of the embodiments, heat from the plasma draws the molten dopant material toward the arc chamber. As dopant material 125 travels up the wicking tip 170, it fills the wicking cavity 171. If an excess amount of dopant material fills the wicking cavity 171, a meniscus may form. The introduction of additional dopant material may cause the dopant material to flow from the wicking cavity 171 into the crucible cavity 121. Both of these cavities may be in direct contact with the interior of the arc chamber 100. This facilitates the vaporization of the dopant material in the crucible cavity 121 and the wicking cavity 171. Further, the design of wicking tip 170 controls the rate at which dopant material 125 can travel up the wicking tip 170, thus controlling the rate at which the dopant material 125 is vaporized.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the arc chamber 100. These electrons collide with the molecules of gas that are fed into the arc chamber 100 through the gas inlet 106. A carrier gas, such as argon, or an etching gas, such as a halogen containing gas, may be introduced into the arc chamber 100 through a suitably located gas inlet 106. The combination of electrons from the cathode 110, the gas and the positive potential creates plasma 145. The plasma 145 may be confined and manipulated by the electrical fields created by the first electrode 130a and the second electrode 130b. Further, in certain embodiments, the electrons and positive ions may be somewhat confined by the magnetic field 190. In certain embodiments, the plasma 145 is confined near the center of the arc chamber 100, proximate the extraction aperture 140. In some embodiments, the plasma 145 may be biased at a voltage which is close to the average of the voltages applied to the first electrode 130a and the second electrode 130b. The heat within the plasma 145 melts the dopant material 125 in the crucible 120 to form a liquid. The heat draws the liquid toward the arc chamber, such that the liquid travels up the wicking tip 170, and flows into the wicking cavity 171. Once in the wicking cavity 171, the liquid dopant material is vaporized and ions from the dopant material are generated and become part of the plasma 145. Alternatively, some of the liquid dopant material may flow from the wicking cavity 171 into the crucible cavity 121, where it is vaporized.

In certain embodiments, the voltage of the cathode 110 is less positive than the voltage of the plasma 145. For example, in one embodiment, the cathode 110 may be at the same voltage as the side walls of the arc chamber 100. The first electrode 130a may be biased at 150V, while the second electrode 130b may be biased at 0V or 20V. Thus, the electrons generated by the cathode 110 are attracted toward the plasma 145. In some embodiments, these emitted electrons or other particles may also strike the dopant material 125, causing it to sputter.

While FIG. 1 shows two electrodes, it is understood that one of these electrodes, such as second electrode 130b and its associated second electrode power supply 135b may be eliminated in some embodiments. In another embodiment, the second electrode 130b is disposed within the arc chamber 100, but is electrically connected to the side walls 101 of the arc chamber 100. Thus, in this embodiment, the second electrode power supply 135b may be eliminated.

Figure 2A:
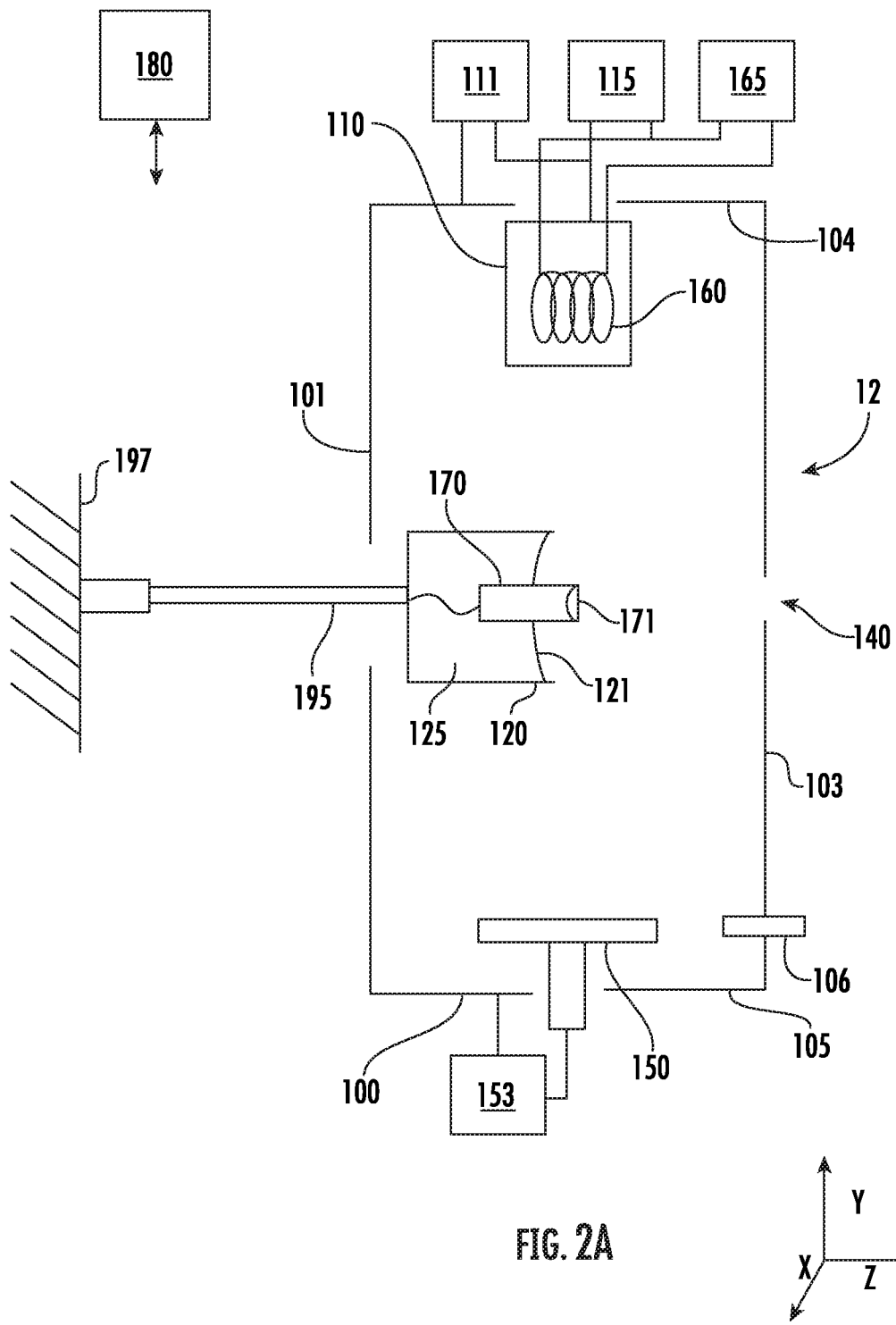
FIG. 2A is an indirectly heated cathode (IHC) ion source having a crucible with a wicking tip in the extended position in accordance with another embodiment.
Figure 2B:
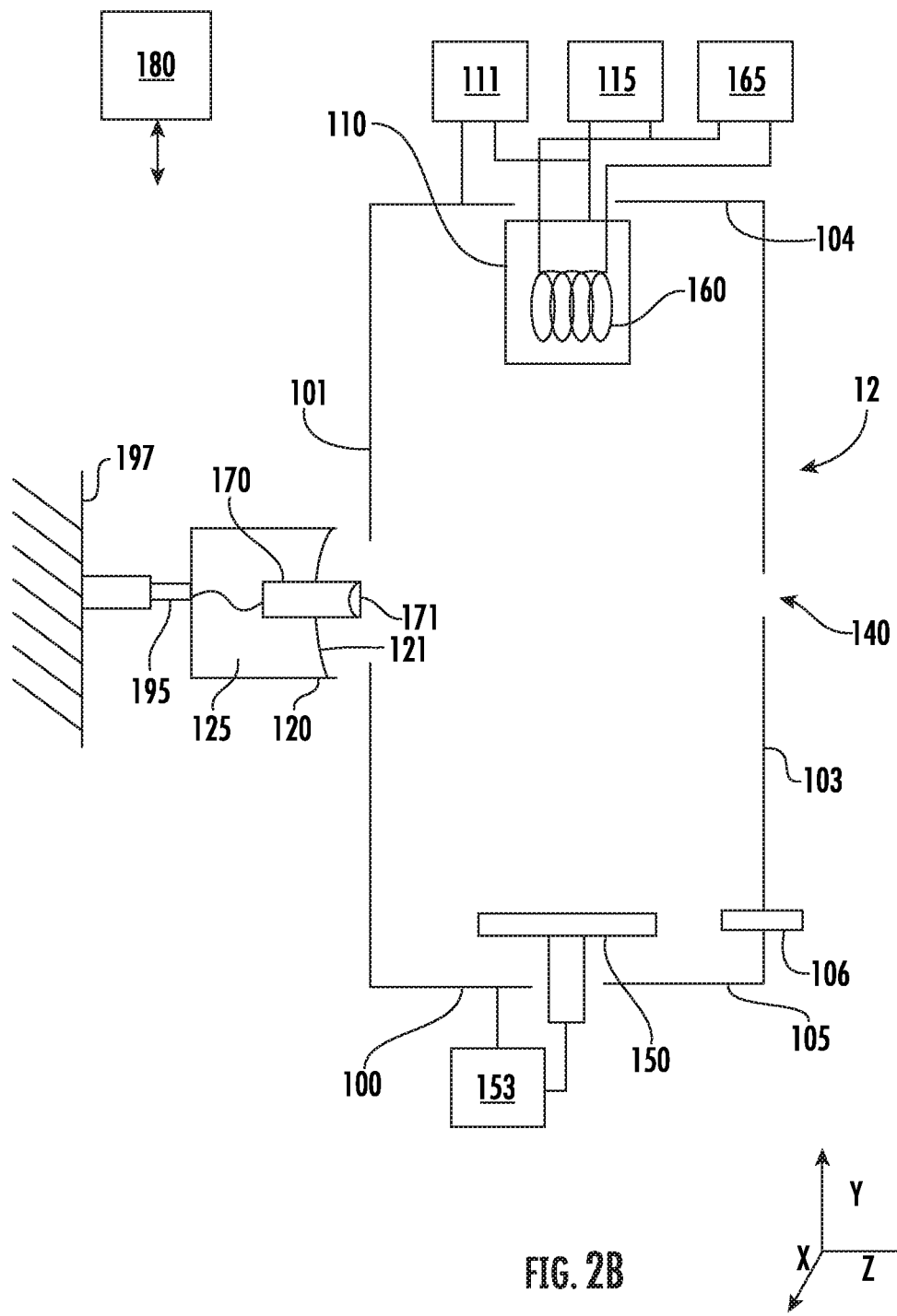
FIG. 2B is the indirectly heated cathode (IHC) ion source of FIG. 2A with the crucible with a wicking tip in the retracted position.

FIGS. 2A-2B show a second embodiment of an IHC ion source 12 that utilizes the crucible 120 with the wicking tip 170. Many of the components in this IHC ion source 12 are identical to those in the first embodiment and have been given identical reference designators. Unlike the IHC ion source 10 shown in FIG. 1, in this embodiment, a repeller 150 is disposed on the second end 105, which is opposite the first end 104. The repeller 150 may be biased relative to the arc chamber 100 by means of a repeller bias power supply 153. In other embodiments, the repeller 150 may be electrically connected to the arc chamber 100, so as to be at the same voltage as the walls of the arc chamber 100. In these embodiments, repeller bias power supply 153 may not be employed and the repeller 150 may be electrically connected to the walls of the arc chamber 100. In still other embodiments, a repeller 150 is not employed. The repeller 150 is made of an electrically conductive material, such as a metal or graphite.

In this embodiment, the crucible 120 is in communication with one end of an actuator 195. FIG. 2A shows the actuator 195 in the extended position such that the crucible 120 is disposed in the interior of the arc chamber 100. The opposite end of the actuator 195 may be in communication with a support 197. In certain embodiments, this support 197 may be the housing of the IHC ion source 12. In certain embodiments, the actuator 195 may be able to change its total displacement. For example, the actuator 195 may be a telescoping design.

FIG. 2B shows the IHC ion source 12 with the actuator 195 in the retracted position. In this position, the crucible 120 is completely outside the arc chamber 100. In certain embodiments, the dopant material 125 cools when the crucible 120 is outside the arc chamber 100. In this way, none of the dopant material 125 enters the arc chamber 100 when the actuator 195 is in the retracted position.

The crucible 120 enters the interior of the arc chamber 100 via one of the plurality of side walls 101 that connects the first end 104 and the second end 105. In certain embodiments, the crucible 120 may enter the interior of the arc chamber 100 through the side wall that is opposite the extraction aperture 140. In other embodiments, the crucible 120 may enter the interior of the arc chamber 100 through a sidewall that is adjacent to the face plate 103.

The wicking tip 170 is disposed in the crucible 120. The wicking tip 170 extends into the crucible 120. In some embodiments, the wicking tip 170 extends to the bottom of the crucible such that dopant material 125 remains in contact with the wicking tip 170, even as the dopant material is being consumed. The crucible 120 may include a front surface that forms a crucible cavity 121. In certain embodiments, the wicking tip 170 includes the wicking cavity 171. In some embodiments, both the crucible and the wicking tip have cavities. In each of the embodiments, as dopant material 125 travels up the wicking tip 170, it fills the wicking cavity 171. If an excess amount of dopant material fills the wicking cavity 171, a meniscus may form. The introduction of additional dopant material may cause the dopant material to flow from the wicking cavity 171 into the crucible cavity 121. Both of these cavities may be in direct contact with the interior of the arc chamber 100. This facilitates the vaporization of the dopant material in the crucible cavity 121 and the wicking cavity 171. Further, the design of wicking tip 170 controls the rate at which dopant material 125 can travel up the wicking tip 170, thus controlling the rate at which the dopant material 125 is vaporized.

Figure 3D:
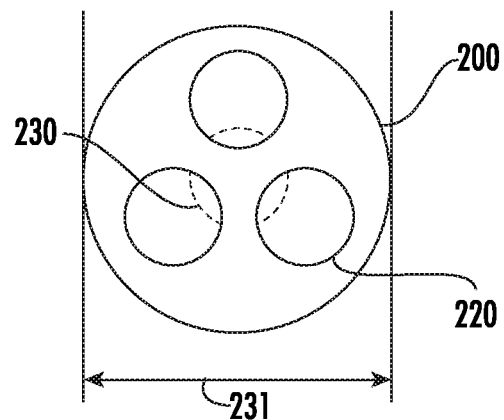

FIGS. 3A-3E shows a first embodiment of the wicking tip 170. In this embodiment, the wicking tip 170 comprises a wicking tube 200. As seen in FIGS. 3A-3B, the wicking tube 200 may be a cylindrical body having a length and a primary outer diameter. One or more transport rings 210 are included along the length of the wicking tube 200. The transport rings 210 are regions that have a smaller outer diameter than the primary outer diameter. In some embodiments, the primary outer diameter 231 (see FIG. 3D) is between 0.125 and 0.75 inches, while the outer diameter of the transport rings 210 is between 0.087 and 0.62 inches. The height of the transport rings 210 is not limited, but may be between 0.25 and 2.0 inches, depending on the desired flow rate. Specifically, increases in the height of the transport rings 210 increase the size of the openings that connect the exterior of the wicking tube 200 to the conduits 220.

Figure 3E:
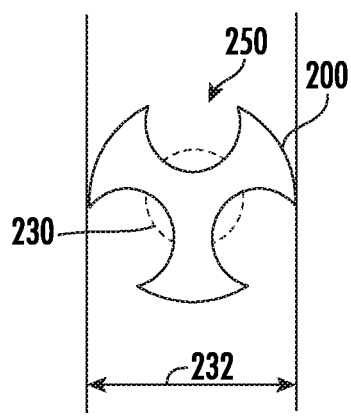

Within the wicking tube 200 are one or more conduits 220. The diameter of these conduits 220 may vary, and may be between 0.062 and 0.250 inches in some embodiments. These conduits 220 are completely contained within the primary outer diameter 231, as shown in the top view of FIG. 3B, as well as in FIG. 3D. In other words, if the entire wicking tube 200 had a diameter equal to the primary outer diameter 231, the conduits 220 would be completely within the cylindrical body. However, the outer diameter of the transport rings 210, shown as diameter 232 in FIG. 3E, is smaller than the diameter needed to contain the conduits 220. Consequently, the transport rings 210 cut into the conduits 220, creating openings 250 that allow paths from outside the wicking tube 200 to the conduits 220.

FIGS. 3D-3E also show the wicking cavity 230. Where the wicking cavity 230 overlaps the conduits 220, a passageway is created from the conduits 220 to the wicking cavity 230. Since the cross-sectional area of these passageways is smaller than the combined cross-sectional area of the plurality of conduits 220, a choke point is created. The size of the choke point and the ratio of the cross-sectional area of the passageways to the combined cross-sectional area of the plurality of conduits 220 may determine the flow rate of dopant material to the wicking cavity 230.

There may be more than one conduit 220 within the wicking tube 200. In this way, a portion of the wicking tube 200 exists even in the area of the transport rings 210.

In another embodiment, exactly one conduit 220 may be utilized. In this embodiment, rather than utilizing transport rings, openings 250 may be created along the length of the wicking tube 200 in the radial direction to connect the outside of the wicking tube 200 to the conduit 220, as shown in FIG. 4D. These openings 250 may be tapered so as to increase the amount of material that may enter each opening 250.

Figure 4A:
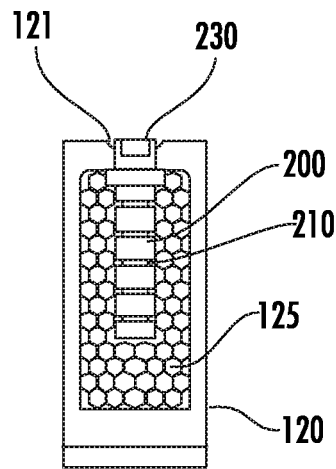
FIGS. 4A-4B show the wicking tip of FIGS. 3A-3E disposed in a crucible.
Figure 4B:
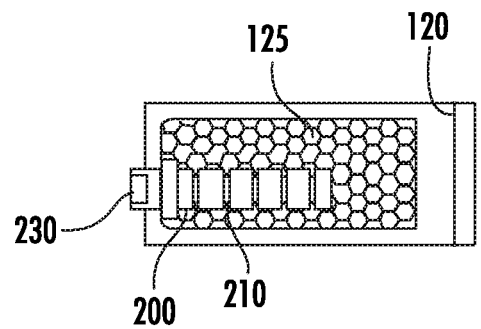
Figure 4C:
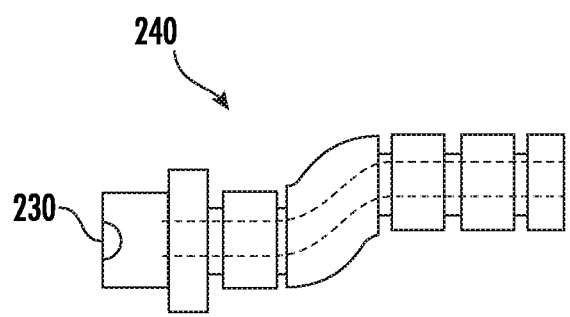
FIG. 4C shows a variation of the wicking tip shown in FIG. 3A.
Figure 4D:
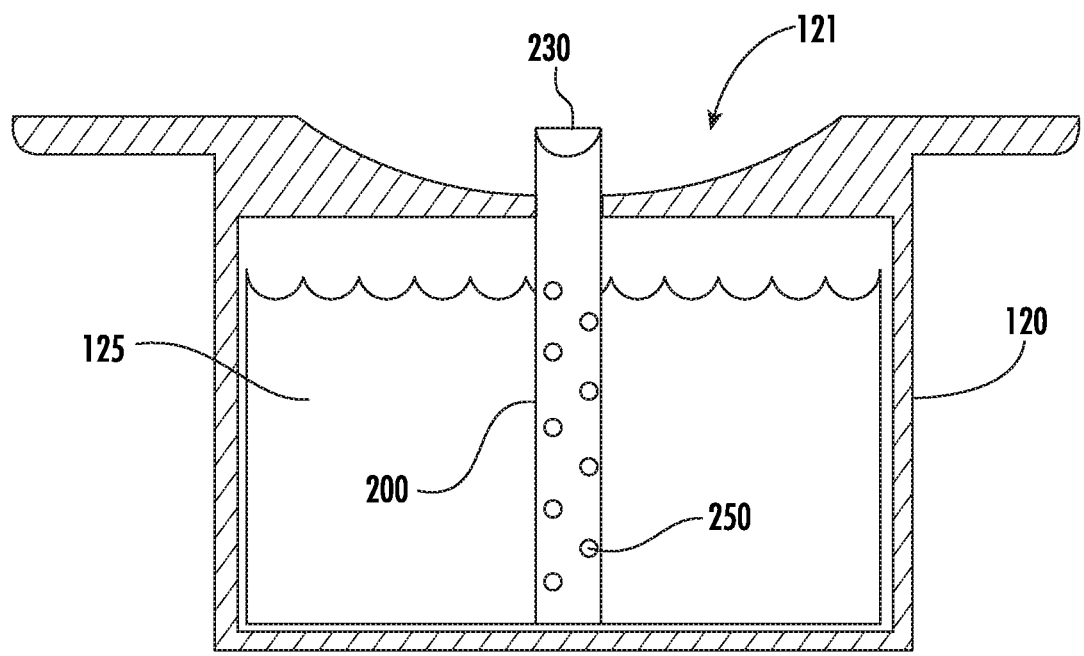
FIG. 4D shows a variation of the wicking tip of FIGS. 3A-3E disposed in a crucible.
Figure 4E:
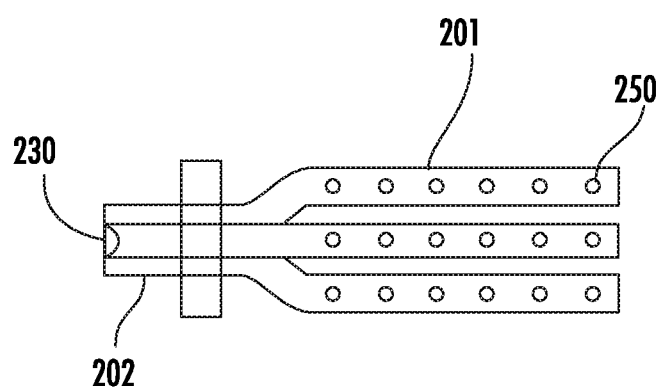
FIG. 4E shows another variation of the wicking tip of FIGS. 3A-3E.

A modification of the wicking tube of FIG. 4D is shown in FIG. 4E. In this figure, there are a plurality of lower wicking tubes 201 that merge into an upper wicking tube 202. The lower wicking tubes 201 have openings 250, as shown in FIG. 4D. In addition, the lower wicking tubes 201 also have one or more conduits 220, similar to those in FIG. 4D. These conduits 220 then enter the upper wicking tube 202 and may remain as separate conduits in the upper wicking tube 202. In other embodiments, the conduits 220 may merge into one conduit in the upper wicking tube 202. At the top of the upper wicking tube 202, the conduits 220 connect to the wicking cavity 230.

The wicking tube 200 may be made of any suitable material, such as graphite or a refractory metal, such as tungsten, tantalum or molybdenum. The length of the wicking tube 200 may be determined based on the depth of the crucible 120. The diameters of the conduits 220 may be selected to control the rate that the liquid dopant material travels to the wicking cavity 230. Larger diameters allow more material to be transported and also increase the size of the openings that connect the exterior of the wicking tube 200 to the conduits 220. Further, the number of conduits may be adjustable.

As seen in FIG. 3C, in all of these embodiments, the front surface of the wicking tube 200 may include a wicking cavity 230. The term "front surface" refers to the surface that is in communication with the arc chamber 100. The wicking cavity 230 may be concave. However, it is understood that other shapes may also be used. For example, the wicking cavity 230 may be a counterbore having different shapes. Any inward depression or holes on the front surface may serve as the wicking cavity 230. As molten dopant material 125 travels up the conduits 220, it collects in the wicking cavity 230. The depth, shape and radius of the wicking cavity 230 may be selected based on the amount of molten dopant material that is to be exposed to the plasma. A deeper wicking cavity 230 may hold more dopant material, allowing a higher concentration of dopant ions in the plasma.

In certain embodiments, the conduits 220 may traverse the entire length of the wicking tube 200, from the wicking cavity 230 to the distal end. In other embodiments, the back end of the wicking tube 200 may be closed, such that the conduits 220 are not exposed on the back end. The term "back end" refers to the end of the wicking tube 200 opposite the front surface. However, in all embodiments, the wicking tube 200 comprises a structure having one or more conduits 220 disposed within. These conduits 220 are in communication with a wicking cavity 230 that is disposed at the front surface of the wicking tube 200. One or more openings 250 may be disposed along the length of the wicking tube 200 that connect the exterior of the wicking tube 200 to the conduits 220. The number and size of the conduits 220 and the openings may help determine the rate at which dopant material travels to the wicking cavity 230.

Further, while FIGS. 3A-3E show the wicking tube 200 as having a cylindrical body, other shapes are also possible. For example, the wicking tube 200 may be a rectangular prism or another shape.

FIG. 4A shows the wicking tube 200 of FIGS. 3A-3E disposed in a crucible 120, which is partially filled with dopant material 125. Note that in operation, the dopant material 125 melts, enters the openings 250 along the transport rings 210, and travels up the conduits 220 to the wicking cavity 230, which is in communication with the arc chamber 100. The orientation shown in FIG. 4A is suitable for the ion source shown in FIG. 1, wherein the crucible 120 is maintained in an upright or vertical position. In this embodiment, the central axis of the wicking tube 200 may be coaxial with the central axis of the crucible 120, such that the wicking tube 200 is in the center of the crucible 120 in the radial direction. In these embodiments, the crucible 120 may be a hollow cylinder or a hollow rectangular prism. In other embodiments, the crucible 120 may be tapered such that the top of the crucible is wider than the bottom of the crucible 120.

FIG. 4B shows the wicking tube 200 disposed in a crucible 120 which is horizontally oriented, such as is done in the embodiment shown in FIGS. 2A-2B. In this embodiment, it may be beneficial to offset the wicking tube 200 from the central axis of the crucible 120. In this way, the dopant material 125 may remain in contact with the wicking tube 200 even as the dopant material 125 is being consumed. The wicking tube 200 may be disposed in the crucible 120 such that it contacts or is near the lowest side of the crucible 120, if desired. In these embodiments, the crucible 120 may be a hollow cylinder or a hollow rectangular prism. In other embodiments, the crucible 120 may be tapered such that the top of the crucible is wider than the bottom of the crucible 120. By using a taper, the dopant material 125 may be drawn toward the top of the crucible 120 due to the sloped walls of the crucible 120. The front surface of the crucible 120 may have a cavity, which may be concave, convex or a detailed surface that allows any overflow of dopant material 125 from the wicking cavity 230 to be retained.

FIG. 4C shows a different wicking tube 240 that may be used with the crucible shown in FIG. 4B. In this embodiment, rather than moving the position of the wicking cavity 230 within the crucible 120 to accommodate the horizontal orientation, the shape of the wicking tube 240 is changed. In this embodiment, the body of the wicking tube 240 is curved. The conduits 220 within the body would be similarly curved. This configuration allows the front surface of the wicking tube 200 (i.e. the wicking cavity 230) to be positioned along the central axis of the crucible 120 while also allowing at least a portion of the wicking tube to be close to the lowest side of the crucible 120.

FIG. 4D shows a different configuration of the wicking tube 200. In this embodiment, rather than using transport rings 210, the cross-sectional area of the body of the wicking tube may be constant through at least a portion of its length. Openings 250 are disposed in the wicking tube 200, which are in communication with the one or more conduits 220 that are disposed within the cylindrical body of the wicking tube 200. As noted above, these openings may be tapered so as to increase the amount of material that may enter each opening 250.

Figure 5A:
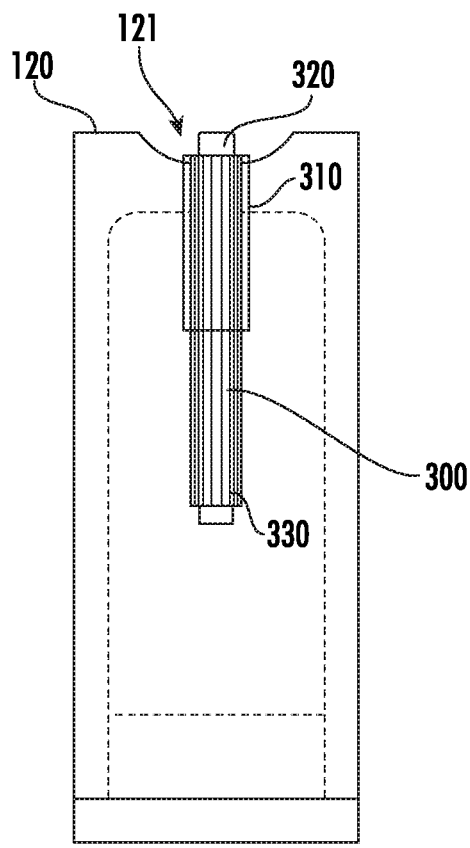
FIGS. 5A-5C shows a wicking tip according to another embodiment.
Figure 5C:
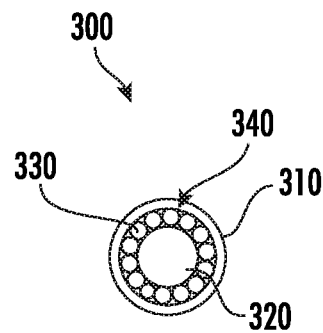
Figure 5B:
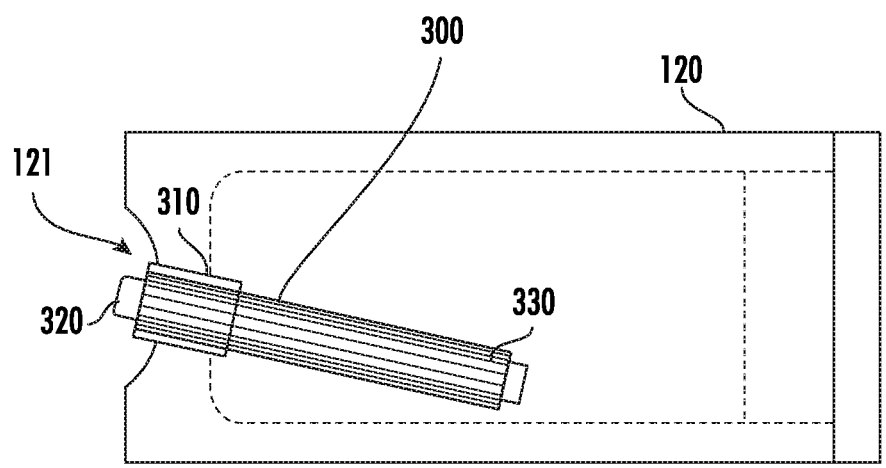

FIGS. 5A-5C show a wicking tip according to another embodiment. In this embodiment, the wicking tip is constructed as a wicking wire assembly 300. FIG. 5C shows a cross-sectional view of the wicking wire assembly 300. The wicking wire assembly 300 comprises a solid inner cylinder 320 disposed in an outer hollow cylinder 310. The cylinders may be constructed from graphite, ceramic, a high temperature material or a refractory metal. In the annular ring 340 between the outer hollow cylinder 310 and the solid inner cylinder 320, a plurality of rods 330 are disposed. In one embodiment, the diameter of each of the rods 330 is approximately equal to the width of the annular ring 340. In other embodiments, multiple rods 330 may be disposed in the radial direction in the annular ring 340. The rods 330 are constructed from graphite or a refractory metal, such as tantalum or tungsten. The rods 330 may have a round cross-section, although other shapes are also possible as long as spaces are created between the rods 330. The space between the rods 330 in the annular ring 340 provide the conduits for the molten dopant material to travel toward the top end of the wicking wire assembly 300. In one embodiment, the top ends of the rods 330 terminate at the front end before the end of the outer hollow cylinder 310. This creates a wicking cavity at the front end of the wicking wire assembly 300 into which the molten dopant material 125 may be collected. In certain embodiments, the solid inner cylinder 320 may extend beyond the outer hollow cylinder 310 in the front end so that it is extended into the arc chamber 100. This serves to further heat the solid inner cylinder 320, which helps to melt the dopant material 125. In this embodiment, the wicking cavity may be ring shaped. In some embodiments, the rods 330 and the solid inner cylinder 320 extend in the bottom direction further than the outer hollow cylinder 310. By terminating the outer hollow cylinder 310 before the rods 330 and the solid inner cylinder 320 in the bottom direction, more surface area is made available for the molten dopant material 125 to enter the annular ring 340. The region where the outer hollow cylinder 310 is not present allows the rods 330 to be in direct contact with the dopant material that is exterior to the wicking wire assembly 300. Thus, this region serves as the openings that allow molten dopant material to enter the internal conduits.

In some embodiments, the rods 330 may be tantalum wires. In operation, the dopant material 125 melts, enters the spaces between the rods 330 and travels between the rods 330 in the annular ring 340 to the cavity, which is in communication with the arc chamber 100. The rods 330 may have a diameter between 0.005 and 0.125 inches. The annular ring 340 may have a width of between 0.125 to 0.750 inches. In some embodiments, there may be between three and one hundred rods 330 disposed in the annular ring 340. The rods 330 may have the same length or may be varied in length. The length may be between 0.5 and 2.0 inches.

The orientation shown in FIG. 5A is suitable for the ion source shown in FIG. 1, wherein the crucible 120 is maintained in an upright or vertical position. As described above, the crucible 120 may include a crucible cavity 121 at the front surface of the crucible 120. The rods 330 may extend all or most of the way to the bottom of the crucible 120 so as the rods 330 are still in contact with the dopant material even as the dopant material is being consumed.

The orientation shown in FIG. 5B is suitable for the ion source shown in FIGS. 2A-2B, wherein the crucible 120 is maintained in a horizontal position. In this embodiment, the wicking wire assembly 300 is disposed within the crucible 120 such that the bottom of the wicking wire assembly 300 contacts the lowermost wall of the crucible 120. Thus, the wicking wire assembly 300 may be disposed at a slant. This allows the molten dopant material to still be in contact with the rods 330 of the wicking wire assembly 300 even after some of the dopant material has been consumed.

Thus, in this embodiment, the space in the annular ring 340 between the rods 330 serves as the conduits through which the molten dopant material can move. The width of the annular ring, and the size and type of rods determines the rate at which the molten dopant material moves to the front surface of the wicking wire assembly 300.

Figures 6A, 6B, 6C:
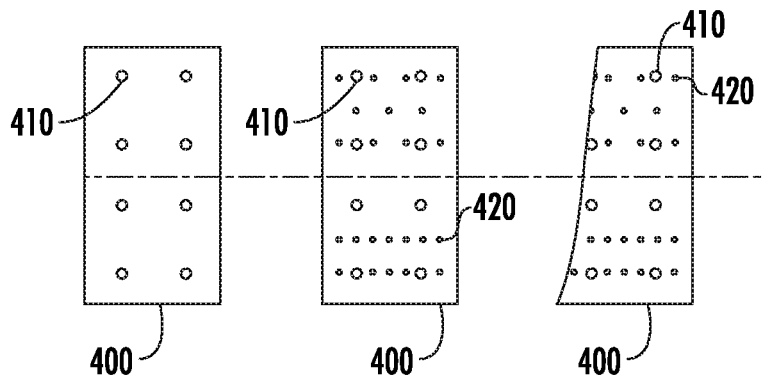
FIGS. 6A-6F shows a wicking tip according to another embodiment.

FIGS. 6A-6F show another embodiment of the wicking tip 170. In this embodiment, a foil 400 is wound to create a porous cylinder. When wound, the foil 400 comprises a plurality of foil layers. The term "foil" is used to denote a sheet of material having a thickness of between about 0.005 and 0.050 inches. The material used to create the "foil" or "foil layer" may be refractory metal. The foil 400 may been a rectangular piece with a plurality of holes 410, such as is shown in FIG. 6A. The holes 410 enable the molten dopant material to move between adjacent layers in the foil 400. Alternatively, the foil 400 may have a rectangular piece with holes 410 and protrusions 420, as shown in FIG. 6B. The protrusions 420 tend to ensure a minimum separation or spacing between adjacent layers when the foil is wound. In this way, the layers of the foil 400 may be spaced further apart when the foil includes protrusions 420. Protrusions 420 may be utilized with metal foils that tend to be very smooth so as to introduce a minimum spacing between the layers. In another embodiment, the foil 400 may have protrusions 420 and may not have holes. The protrusions 420 may extend outward from the foil 400 and may have a height that is between 0.5 and 4.0 times the thickness of the foil 400. The protrusions 420 may be round, or may be square, triangular or another shape. The holes 410 may be round, as shown in FIGS. 6A-6C. However, in other embodiments, the holes may be oval, hexagonal, square or another shape.

Alternatively, one edge of the foil 400 may sloped, as shown in FIG. 6C. When the foil of FIG. 6C is wound, starting at the smaller side, a cavity is created at the front end of the foil 400. This effectively allows the creation of a wicking cavity, similar to that in the other embodiments.

The foil 400 may be folded and wound in a plurality of different ways. In one embodiment, shown in FIG. 6E, the foil 400 is wound in a spiral. If the foil is shaped as shown in FIG. 6C, a wicking cavity is created. In another embodiment, shown in FIG. 6D, the foil 400 is folded as a triangle. In this embodiment, a solid cylinder 450 may be placed inside the triangular shaped foil to control the size of the conduit. The solid cylinder 450 may extend beyond the top surface of the foil 400, to the top surface of the foil 400 or may terminate prior to the top surface of the foil. If the solid cylinder 450 terminates before the foil, a cavity is formed at the top inside the foil 400, where the spaces between foil layers all flow into the cavity. In another embodiment, shown in FIG. 6F, the foil 400 is folded as a hexagon. In this embodiment, a solid cylinder 450 may be placed inside the hexagonal shaped foil to control the size of the conduit. Of course, the foil 400 may be folded into any desired shape, including a square, pentagon, octagon, and oval. In all of these embodiments, the molten dopant material travels in the spacing between adjacent layers of the foil 400. The holes 410 in the foil 400 allow the molten material to move from between one set of layers to another set of layers. This may achieve more uniform flow through each of the spacings.

The spacing between adjacent layers of the foil serves as the conduits. The spacing between adjacent layers of foil, as well as the surface roughness of the foil may determine the rate at which the molten dopant material moves to the front surface of the foil 400. Further, the holes 410 serves as the openings that allow the molten dopant material to enter the internal conduits.

Figure 6D:
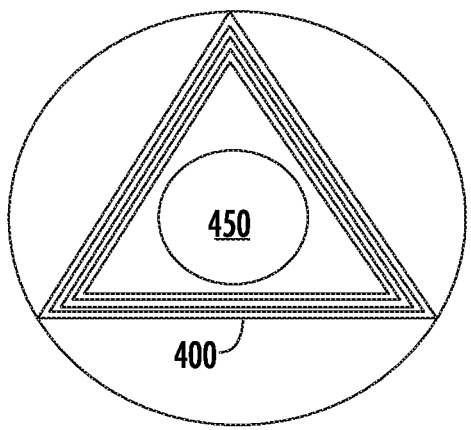
Figure 6E:
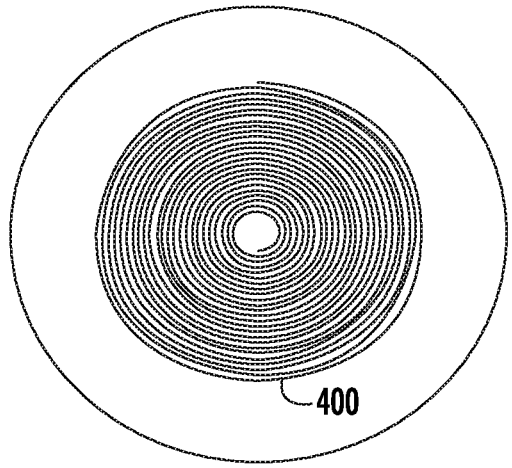
Figure 6F:
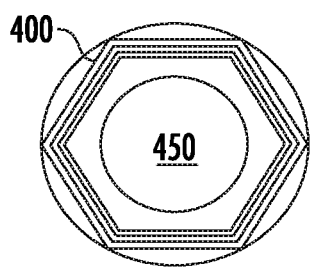

The wound foils, such as those shown in FIGS. 6D-6F, may be inserted into the crucible 120. In another embodiment, a hollow outer cylinder and a solid inner cylinder may be used to create an annular ring. The wound foil, such as those shown in FIGS. 6D-6F, may be disposed in this annular ring. The combination of the hollow outer cylinder, the solid inner cylinder and the wound foil made up the wicking tip. In another embodiment, holding of wound foils may be performed via clamping a ring or tube around the shape whether it be a cylindrical, triangular, hexagonal or another shape. The ring or tube is mechanically compressed around the wound foil. In another embodiment, it may be a beam tacked as well. Shapes could be any organic, or geometric shape as long as there is a passageway from back to front.

In each of the embodiments shown in FIGS. 3-6, the wicking tip 170 includes a body having one or more internal conduits therein through which the molten dopant material may flow. In the embodiment shown in FIGS. 3A-3E, this internal conduit is the conduits 220. In the embodiment shown in FIGS. 5A-5C, this internal conduit is the space between the rods 330 in the annular ring 340. In the embodiment shown in FIGS. 6A-6F, this internal conduit is the spacing between adjacent layers of the wound foil. Further, in each embodiment, there are one or more openings that allow the internal conduits to be in communication with the exterior of the wicking tip. Finally, each embodiment also includes a wicking cavity that is used to collect the molten dopant material that flows through the internal conduit. In addition, the wicking tip 170 in each of these embodiments is disposed in a crucible. This crucible may have a crucible cavity on its front surface to collect molten dopant material that flows out of the wicking cavity.

The embodiments described above in the present application may have many advantages.

First, the use of the wicking tips described herein allow the molten dopant material to move to the front surface of the crucible at a controlled rate. This rate is determined based on the size of the conduits within the wicking tip that leads to the wicking cavity. In addition, the size and number of openings that connect the exterior of the wicking tip 170 to the conduits also contributes to the flow rate.

Second, the configuration of the wicking tip in FIGS. 3A-3E include a choke point. There are a plurality of conduits 220 that are in communication with the wicking cavity 230. In some embodiments, the cross-sectional area of the passageways at which the conduits 220 meet the wicking cavity 230 is smaller than the combined cross-sectional areas of the conduits 220. As best seen in FIG. 3D, the cross-sectional area of the passageways is much smaller than the combined areas of the three conduits 220. This creates a choke point which limits the flow of dopant material into the wicking cavity 230. In some embodiments, the combined cross-sectional area of the conduits 220 is between 1 and 12 times larger than the cross-sectional area of the passageways connecting the conduits 220 and the wicking cavity 230. In some embodiments, the combined cross-sectional area of the conduits 220 is between 3 and 12 times larger than the cross-sectional area of the passageways connecting the conduits 220 and the wicking cavity 230.

Third, these wicking tips allow the crucible to be oriented in a vertical or horizontal configuration. Because the flow rate is controlled, there is little risk of spillage of molten dopant material into the arc chamber 100.

Additionally, the wicking tips include a wicking cavity. The wicking cavity is the place that supplies a larger amount of surface area to the interior of the arc chamber to use as a dopant material being feed to that point by heat. This larger amount of surface area can be concave, convex, counterbores, single or multi ports, as well as any geometric or organic shape that has depth and shape. These shapes are used to supply a usable volume of dopant material which is then be vaporized. The cavity is also capable of holding the dopant material so that it does not drip or spill into the arc chamber.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for holding dopant material in an ion source, comprising:
    a crucible; and
    a wicking tip disposed in the crucible, wherein the wicking tip comprises:
        a body having one or more internal conduits;
        one or more openings allowing the one or more internal conduits to be in communication with an exterior of the body and an interior of the crucible; and
        a wicking cavity disposed at a front end of the wicking tip, wherein the one or more internal conduits flow into the wicking cavity.

2. The apparatus of claim 1, wherein the body comprises a cylindrical portion containing a plurality of internal conduits.

3. The apparatus of claim 2, wherein a portion of the body comprises a primary outer diameter, defined such that the plurality of internal conduits are completely contained within the portion having the primary outer diameter, and wherein transport rings, which are regions having a smaller diameter than the primary outer diameter, are disposed on other portions of the body to create the one or more openings.

4. The apparatus of claim 3, wherein the body and the one or more internal conduits are curved.

5. The apparatus of claim 2, wherein a cross-sectional area of passageways where the plurality of internal conduits is connect to the wicking cavity smaller than a combined cross-sectional area of the plurality of internal conduits, so as to form a choke point.

6. The apparatus of claim 5, wherein the combined cross-sectional area of the plurality of internal conduits is 3 to 12 times larger than the cross-sectional area of passageways where the plurality of internal conduits connect to the wicking cavity.

7. The apparatus of claim 2, wherein the wicking cavity comprises a concave cavity.

8. The apparatus of claim 1, wherein the body contains exactly one internal conduit.

9. The apparatus of claim 1, wherein the body comprises a hollow outer cylinder and a solid inner cylinder, wherein an annular ring is formed between the hollow outer cylinder and the solid inner cylinder, wherein the wicking tip further comprises rods disposed in the annular ring, wherein spacing between the rods in the annular ring comprises the one or more internal conduits.

10. The apparatus of claim 1, wherein the body comprises a foil wound to create the body; wherein spacing between adjacent layers of the foil comprise the one or more internal conduits.

11. An indirectly heated cathode ion source, comprising:
    an arc chamber having a first end and a second end;
    a cathode disposed on the first end; and
    the apparatus of claim 1 disposed at the second end.

12. An indirectly heated cathode ion source, comprising:
    an arc chamber having a first end, a second end, and sidewalls connecting the first end and the second end;
    a cathode disposed on a first end;
    an actuator adapted to extend into and be retracted from the arc chamber; and
    the apparatus of claim 1 disposed on an end of the actuator.

13. An apparatus for holding dopant material in an ion source, comprising:
    a crucible; and
    a wicking tip disposed in the crucible, wherein the wicking tip comprises:
        a solid inner cylinder disposed in a hollow outer cylinder to form an annular ring; and
        a plurality of rods disposed in the annular ring.

14. The apparatus of claim 13, wherein spacing between the plurality of rods create internal conduits through which dopant material travels.

15. The apparatus of claim 14, wherein the plurality of rods extends beyond the hollow outer cylinder at a back end of the wicking tip to provide openings to allow the dopant material to enter the internal conduits.

16. The apparatus of claim 14, wherein the hollow outer cylinder extends further in a front end than the plurality of rods to create a cavity into which the dopant material from the internal conduits collect.

17. The apparatus of claim 13, wherein the plurality of rods comprise tantalum, refractory metal or high temperature wires.

18. An indirectly heated cathode ion source, comprising:
    an arc chamber having a first end and a second end;
    a cathode disposed on the first end; and
        the apparatus of claim 13 disposed at the second end.

19. An indirectly heated cathode ion source, comprising:
an arc chamber having a first end, a second end, and sidewalls connecting the first end and the second end;
a cathode disposed on a first end;
an actuator adapted to extend into and be retracted from the arc chamber; and
the apparatus of claim 13 disposed on an end of the actuator.

* * * * *